United States Patent [19]

Peiffer

[11] 4,054,479
[45] Oct. 18, 1977

[54] ADDITIVE PROCESS FOR PRODUCING PRINTED CIRCUIT ELEMENTS USING A SELF-SUPPORTED PHOTOSENSITIVE SHEET

[75] Inventor: Robert William Peiffer, Jackson, N.J.

[73] Assignee: E. I. Du Pont de Nemours and Company, Wilmington, Del.

[21] Appl. No.: 753,459

[22] Filed: Dec. 22, 1976

[51] Int. Cl.$^2$ .............................................. H05K 3/18
[52] U.S. Cl. .................................... 156/280; 96/35.1; 96/38.4; 156/230; 156/249; 156/902; 174/68.5; 427/97; 427/98
[58] Field of Search .................................. 427/96–98, 427/288, 304–306, 322, 326; 96/35.1, 36.2, 38.4, 115 P; 174/68.5; 156/632, 150, 151, 230, 247, 249, 278, 280, 901, 902; 29/625

[56] References Cited

U.S. PATENT DOCUMENTS

| 3,436,468 | 4/1969 | Haberecht | 427/98 X |
| 3,615,471 | 10/1971 | Lenoble et al. | 96/36.2 X |
| 3,646,572 | 2/1972 | Burr | 427/98 X |
| 3,778,900 | 12/1973 | Haining et al. | 96/36.2 X |
| 3,934,335 | 1/1976 | Nelson | 427/96 X |
| 3,956,041 | 5/1976 | Polichette et al. | 96/36 |

Primary Examiner—William A. Powell

[57] ABSTRACT

Printed circuit boards with plated through-holes are prepared by an electroless plating process using a self-supported, adherent, photohardenable sheet. The self-supported photohardenable sheet preferably is composed of a photopolymerizable material and may be a thick, homogeneous sheet or it may be a sheet reinforced with a foraminous material therein. The self-supported sheet is imagewise exposed to actinic radiation to form an adherent circuit pattern thereon comprising the unexposed areas. Through-holes are introduced into the pad areas of the circuit pattern, powdered catalyst is applied to the adherent pattern and through-holes and the catalytic image is plated in an electroless plating bath. The self-supported sheet may be used without additional catalyzing steps to make single sided, two-sided or multilayered printed circuit boards with plated throughholes and interconnections.

12 Claims, No Drawings

ADDITIVE PROCESS FOR PRODUCING PRINTED CIRCUIT ELEMENTS USING A SELF-SUPPORTED PHOTOSENSITIVE SHEET

BACKGROUND OF THE INVENTION

1. Field of the Invention:

This invention relates to printed circuit boards and more particularly, to such boards having plated through-holes. Still more particularly, this invention relates to the preparation of printed circuit boards with plated through-holes using self supporting photohardenable sheets in an additive plating process.

2. Description of the Prior Art:

Printed circuits can be prepared by depositing copper conductor patterns directly on insulating substrates by processes such as those disclosed in U.S. Pat. Nos. 3,060,024; 3,146,125; 3,259,559; 3,347,724; 3,391,455; 3,506,482; 3,628,999 and 3,791,858. In preparing printed circuits with plated through-holes using electrodes plating, cleaning procedures are frequently needed after activation of holes and circuit lines in order to remove unwanted catalyst from non-circuit areas before electroless plating. Besides the cost of the cleaning procedures, expensive catalyst is wasted in the non-circuit areas. Printed circuits with plated through-holes ae also prepared by electroless plating using substrate layers having dispersed catalytic particles therein. In these instances however, additional masking layers are needed to produce the desired circuit patterns.

Photosensitive and particularly photohardenable layers are conventionally used to prepare printed circuit boards. The use of such layers is disclosed in U.S. Pat. Nos. 3,469,982; 3,526,504; 3,622,334; 3,778,270; 3,837,860 and French Pat. No. 7211658. Also self supported photohardenable sheets have been disclosed in U.S. Pat. Nos. 3,865,589; 3,210,187; 3,259,499, as well as Belgian Pat. No. 596,378 and British Pat. No. 618,181. These imaged, photohardenable and photosensitive sheets are processed by removing unhardened material from the sheet to produce a mask image. Also, no provision is made to introduce plated through-holes by the processes disclosed.

SUMMARY OF THE INVENTION

In accordance with this invention there is provided a process for preparing printed circuit boards having plated through-holes from a self supported, adherent, photohardenable sheet which comprises, in either order, 1. exposing a surface of the self supported sheet imagewise to actinic radiation to reduce adherence of those areas receiving radiation; and
2. introducing holes through the sheet; then
3. applying to the surface of the sheet and the through-holes therein material catalytic to electroless plating which adheres to the underexposed surface and hole areas; and
4. applying electroless plating solution to the catalytic and hole surfaces to produce an electrically conductive circuit.

DETAILED DESCRIPTION OF THE INVENTION

The self supported, adherent, photohardenable sheet useful in the process of this invention may be a substantially homogeneous, solid, photohardenable sheet or such sheet reinforced with a foraminous material. In either embodiment, the photohardenable material must be tacky or adherent to finely divided catalytic material when unexposed to actinic radiation and hard or unadherent when exposed.

Preferably, a printed circuit board with plated through-holes is prepared from a reinforced, self supported, photopolymerizable sheet which comprises a foraminous material, such as a fabric, saturated with a tacky composition capable of addition polymerization upon exposure to actinic radiation. The reinforced, self supported, photopolymerizable sheet may have adhered to each side with low to moderate adherence, a thin, flexible, polymeric cover film which transmits actinic radiation.

In the preferred process of this invention, one side of the reinforced, self supported, photopolymerizable sheet with strippable cover films thereon is imagewise exposed to actinic radiation through a contact positive transparency of a circuit pattern forming hardened, nontacky areas. Through-holes are then introduced through the sheet in register with the unexposed image circuit patterns by drilling, punching, or otherwise piercing the sheet. Alternatively through-holes may be introduced into the sheet before imagewise exposure. After through-holes are introduced into the imaged sheet, the cover film is removed from the exposed side without transfer thereto of either exposed or underexposed areas of the photopolymerizable material. Catalytic material, e.g., copper powder, is applied to the surface of the imaged sheet. The catalyst material adheres only to the underexposed areas and the walls of the through-holes. After excess catalyst material has been removed, the treated sheet can be cured, e.g., by baking or by high intensity uniform exposure to actinic radiation, to harden the remaining underexposed areas of the sheet and to improve catalyst adhesion to the imaged sheet. The remaining strippable cover film can then be removed from the reverse side of the catalyst sheet, and the catalytic printed circuit image is then treated with an electroless plating solution, e.g., by immersion, at least until a conductive printed circuit is formed.

In another embodiment of this embodiment complementary printed circuits may be prepared on each side of a self-supported photopolymerizable sheet. By complementary printed circuits or circuit patterns is meant printed circuits having a functional relationship, e.g., a set of printed circuits having plated through holes in common. The sheet usually is substantially opaque to actinic radiation. Each side of the self-supported photopolymerizable sheet with strippable cover films thereon is imagewise exposed to actinic radiation through a contact positive transparency of a complementary circuit pattern. Through-holes are introduced through the sheet in register with the unexposed imaged circuit patterns, the cover films are removed from the sheet and catalytic material is applied to both surfaces and the holes of the sheet. After excess catalyst material has been removed the sheet can be cured by baking. The catalytic printed circuit images and holes are then treated with electroless plating solution until a conductive printed circuit is formed.

A further embodiment of the process of this invention for forming multilayered printed circuit boards with plated through-holes using a self-supported, adherent, photopolymerizable sheet having on each surface a strippable cover film comprises, (1) exposing the self-supported, adherent, photopolymerizable sheet through the cover film imagewise to actinic radiation; (2) removing the strippable cover film; (3) applying finely divided catalyst material to the surface to form a catalytic image; and (4) treating the catalytic image with an electroless plating solution to form a printed circuit substrate, then, using the printed circuit substrate; (5) laminating the surface of an adherent, photohardenable layer of a photohardenable element comprising an adherent photohardenable layer and a strippable cover film thereon, to the printed circuit substrate; then, in either order; (6) imagewise exposing the laminated element through the cover film to actinic radiation and (7) introducing through holes into the laminated element; then (8) removing the strippable cover film; (9) applying finely divided catalyst material to the surface and the holes to form a catalytic image; (10) treating the catalytic image and holes with an electroless plating solution to form a conductive printed circuit and holes; and (11) curing the laminated element by baking. If more than two printed circuit layers are desired, steps 5, 6, 8, 9, and 10 may be carried out one or more times before the complete sequence of steps 5 through 10 are completed. Similarly, the reverse side of the self-supported, adherent, photopolymerizable sheet may be used as described above to increase the number of circuit layers. If interconnections between adjacent layers are desired, holes may be punched or drilled into the photohardenable layer before it is laminated in register to the printed circuit substrate. In this embodiment, the photohardenable layer laminated to the printed circuit substrate preferably is the same material as that used in the self-supported, adherent, photopolymerizable sheet and is of the type that requires no curing between laminations. If baking is needed between laminations, step 7 may include activation of the through-holes by conventional tin-palladium catalyst such as that disclosed in U.S. Pat. No. 3,562,038.

Preferred self-supported, adherent, photohardenable, sheets are reinforced with foraminous material. The foraminous material generally may be any electrically non-conductive, porous, sheet or web such as woven or non-woven fabrics, papers or other mesh of monofilament or yarn-like fibers. Foraminous or mesh materials useful as reinforcement within the photohardenable layer include cotton and other fabrics made from naturally occurring fibers, synthetic fabrics such as nylon, polyarylamids, polyesters, e.g., polyethylene terephthalate, polypropylene and the like, and woven fiber glass, papers, e.g., filter paper or other such non-woven materials made from the aforementioned fibers. The reinforced, adherent, photohardenable sheet may be manufactured by any conventional or convenient way. For example, a foraminous sheet or web may be dipped into, or coated with, a solvent or a solution of the photohardenable composition. After drying, the foraminous sheet is saturated with the photohardenable composition. Alternatively, fibers or mesh may be embedded in the photohardenable composition by a lamination type process to form the reinforced sheet. A suitable, temporary, removeable, cover film is preferably laminated to each side of the reinforced sheet to protect the sheet during storage and processing.

The self-supported, adherent, photohardenable sheet in some instances may contain no reinforcing material. In this instance the photohardenable material is a solid or at least a semisolid and may be either rigid or elastic. The self-supported sheet generally has a thickness between 0.002 inches and 0.20 inches, depending on the nature of the photohardenable material used. Preferably the photohardenable material is a photopolymerizable composition. The self-supported, adherent, photohardenable sheet with no reinforcement therein may be prepared by coating a layer of photohardenable composition on a suitable temporary film support. After drying the photohardenable stratum, there is laminated to the surface thereof a removable cover films. Alternatively, several such sheets may be laminated together between such films to form proportionately thicker sheets.

A suitable temporary removable cover film which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch ($\sim 0.006$ cm.) to 0.008 inch ($\sim 0.02$ cm.) or more. If exposure is to be made before removing the support film, it must, of course, transmit a substantial fraction of the actinic radiation incident upon it. If the film is removed prior to exposure, no such restrictions apply. A particularly suitable film is a transparent, polyethylene terephthalate film having a thickness of about 0.001 inch ($\sim 0.0025$ cm.).

The process of this invention can be used with many types of photohardenable film sheets. Useful film sheets comprise an adherent, photosensitive layer which can be self-supporting and contiguous to temporary, removable film supports or cover films which preferably transmit actinic radiation. The photohardenable composition includes photopolymerizable compositions capable of addition polymerization and photocrosslinkable compositions. Many examples of such photohardenable compositions are set forth in the following United States patents which are incorporated herein by reference: Nos. 3,060,024; 3,469,982; 3,526,504; 3,547,730; 3,622,334; 3,649,268; 3,854,950 and French Patent 7211658. The basic requirement of the photohardenable layer or sheet is that imagewise exposure either directly forms or can be rendered to form, e.g., by heating, tacky and nontacky areas. Suitable photohardenable compositions having adequate adherence can be determined conventionally as for example in the aforementioned U.S. Pat. No. 3,649,268. Photohardenable compositions which are particularly preferred are photopolymerizable compositions containing at least one free radical initiated, chain propagating, addition polymerizable compound containing at least one terminal ethylenic group, preferably two terminal ethylenic groups, an addition polymerization initiator activatable by actinic radiation, and a compatible macromolecular organic polymer binder.

Suitable binders which can be used as the sole binder or in combination with others include the following: Polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene/1,3-polymers, chlorinated rubber, and styrene/butadiene/styrene, styrene/isoprene/styrene block copolymers; high molecular weight polyethylene oxides of polyglycols haing an average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

Suitable monomers which can be used as the sole monomer or in combination with others include the following: t-butyl acrylate, 1,5 -pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of Bisphenol-A, di-(2-methacryloxyethyl) ether of Bisphenol-A, di-(3-acryloxy-2-hydroxypropyl) ether of Bisphenol-A, di-(2-acryloxyethyl) ether of Bisphenol-A, di-(3-methacryloxy-2-hydroxypropyl) ether of tetrachloro-Bisphenol-A, di-(2-methacryloxyethyl) ether of tetrachloro-Bisphenol-A, di-(3-methacryloxy-2-hydroxypropyl) ether of tetrabromo-Bisphenol-A, di-(2-methacryloxyethyl) ether of tetrabromo-Bisphenol-A, di-(3-methacryloxy-2-hydroxypropyl) ether of 1,4-butane diol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethyacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photohardenable layer can also contain at least one of the following free-radical initiated, chain-propagating, addition polymerizable, ethylenically unsaturated compounds having a molecular weight of at least 300. These monomers include, preferably, an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages, particularly when present as terminal linkages, and especially those wherein at least one and preferably most of such linkages are conjugated with a double bonded carbon, including carbon doubly bonded to carbon and to such hetero atoms as nitrogen, oxygen and sulfur. Outstanding are such materials wherein the ethylenically unsaturated groups, especially the vinylidene groups, are conjugated with ester or amide structures.

A preferred class of free-radical generating addition polymerization initiators activatable by actininc light and thermally inactive at and below 185° C. includes the substituted or unsubstituted polynuclear quinones which are compounds having two intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tert-butylanthraquinone, oc*amethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloroanaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in Plambeck U.S. Pat. No. 2,760,863 and include vincinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin and α-phenylbenzoin. In addition the photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes may be used. Other suitable polymerization initiators are Michler's Ketone, benzophenone 2,4,5-triphenylimidazolyl dimers with hydrogen doners, and mixtures thereof as described in U.S. Pat. Nos. 3,427,161; 3,479,185 and 3,549,367.

Thermal polymerization inhibitors that can be used in photohardenable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenthiazine, pyridine, nitrobenzene and dinitrobenzene, p-toluquinone and chloranil.

Dyes, pigments or other absorbers of actinic radiation may be added to the photohardenable composition particularly when the self-supported sheet is to be imaged on both sides. Generally, however, the use of such absorbers are unnecessary when the self supported sheet is sufficiently thick or where the reinforcing material is substantially opaque or scatters light to a high degree.

In the process of this invention, finely divided material catalytic to electroless plating is adhered to the tacky image areas of the exposed photosensitive surface and then treated with electroless plating solution to produce a conductive printed circuit. Such catalytic material may be finely divided, particulate metals or metal oxides such as titanium, aluminum, copper, gold, silver, palladium, zinc, cobalt, iron, nickel, titanous oxide, copper oxide, etc., or mixtures thereof. The finely divided catalytic material may be powders, slurries, colloidal suspensions or be coated carriers such as described in U.S. Pat. No. 3,031,344.

The process of this invention provides printed circuit boards with plated through-holes inexpensively in the various configurations described. The use of additional masking layers has been eliminated, as well as reduction in electroless plating catalyst and cleaning costs has been achieved.

The invention will be illustrated by, but is not intended to be limited to the following examples wherein the percentages are by weight.

EXAMPLE 1

A single sided, printed circuit board with plated through-holes is prepared using an electroless plating process and a homogeneous self-supported photohardenable sheet.

A homogeneous self-supported photohardenable sheet is prepared from three photopolymerizable elements each of which comprises a 0.0019 inch (~0.0048 cm.) thick, tacky, photopolymerizable layer having on one surface a 0.001 inch (~0.0025 cm.) thick, polyethylene terephthalate strippable support film, and on the other surface a 0.001 inch (~0.0025 cm.) thick, strippable, polyethylene cover film having less adhesion to the layer than the support has to the layer. The tacky photopolymerizable layer contains, as major ingredients: 40% of an unsaturated polyurethane having 0.5% unsaturation and a molecular weight of ~1,900; 20% of an acrylonitrile/butadiene/styrene copolymer having a specific gravity of ~1.07; 30% trimethylolpropane triacrylate; 5% benzophenone and 5% 4,4'-bis(dimethylamino) benzophenone. In its unexposed state, the layer adherently retains copper powder and in its exposed state the layer does not retain copper powder.

The polyethylene cover film is removed from two photopolymerizable elements, and the uncovered photopolymerizable layers are laminated together by passing through pressure rolls at about 120° C to give ~0.0038 in. (~0.0096 cm.) photopolymerizable layer with strippable, polyethylene terephthalate supports on each side. One of the strippable supports is removed from the 0.0038 in. photopolymerizable sheet, and the photopolymerizable layer of a third element is laminated thereto to give ~0.0057 in. (~0.0144 cm.) photoplymerizable sheet with strippable, polyethylene terephthalate supports on each side.

One side of the laminated sheet is exposed for 45 seconds through a contact positive transparency of a circuit pattern to actinic radiation using a carbon arc source (a nuArc Plate Maker No. FT-26M-2 of the flip top type, manufactured by nuArc Co., Inc.). Through-holes are introduced into the exposed laminated sheet by drilling holes in the pad areas of the unexposed circuit pattern, using a 1.5mm drill at 15,000 rpm. The strippable support is removed from the imaged surface of the photopolymerizable sheet and copper powder having an average particle size of 11 μm is dusted onto the exposed surface and into the through holes. Excess copper is removed with a fine spray of water to clean, clearly defined, circuit pattern.

The sheet with the copper powder image thereon is uniformly exposed for 3 minutes to the carbon arc source through the strippable support on the rear surface. The strippable support is removed from the sheet to give a flexible, homogeneous, self-supporting photohardened sheet having a copper powder circuit image thereon. The sheet with the catalyzed pattern and through-holes is taped to a temporary surface and is immersed in an electroless copper plating solution similar to that of Example II of Zeblisky et al., U.S. Pat. No. 3,095,309. After 4 hours, the sheet is removed from the solution and the temporary surface is removed. The self-supporting sheet has a conductive circuit pattern thereon with conductive, plated through-holes.

EXAMPLE 2

A single sided, printed circuit board with plated through-holes is prepared using an electroless plating process and a self-supported photohardenable sheet reinforced with a foraminous material.

A 2 inch × 4 inch (~5×10 cm.) piece of an aramid nonwoven fabric (a fabric made from high modulus, high strength, aromatic polyamid fiber) is soaked for 15 minutes in a coating solution comprising 25% of the tacky photopolymerizable composition described in Example 1 and 75% of methylene chloride. The soaked fabric is air dried for one half hour and then 0.001 inch (~0.0025 cm.) polyethylene terephthalate removable cover films ae laminated to each side.

As described in Example 1, one side of the laminated sheet is imagewise exposed to actinic radiation through a contact positive transparency of a circuit pattern. Through-holes are introduced into the laminated sheet by punching holes in the pad areas of the unexposed circuit pattern. The removable cover film is removed from the imaged surface and copper powder is applied to this surface and into the through-holes to give a clean, clearly defined, circuit pattern.

The sheet with the copper powder image thereon is uniformly exposed on both sides for 3 minutes to the carbon arc source of Example 1. The remaining film is removed from the rear surface of the imaged, self-supported sheet, and the sheet is immersed in an electroless copper plating solution as described in Example 1. After 4 hours, the sheet is removed from the plating solution, and the self-supporting sheet bearing conductive circuit pattern thereon and plated through-holes therein is baked at 160° C. for 1 hour to improve the ductility of the copper.

EXAMPLE 3

A two-sided, printed circuit board with plated through-holes is prepared using an electroless plating process and a self-supported photohardenable sheet reinforced with a foraminous material.

A square piece of cheese cloth is dipped in a methylene chloride solution of the photopolymerizable composition described in Example 1 and then air dried for two hours. The polyethylene cover film is removed from two photopolymerizable elements similar to those described in Example 1 and the coated cheese cloth is laminated between the two photohardenable layers to form a reinforced photopolymerizable sheet with removable, polyethylene terephthalate supports on each side.

Throug-holes are introduced into the laminated sheet in a desired pattern by drilling holes using a 1.5 mm drill at 15,000 rpm. Both sides of the laminated sheet are imagewise exposed for 30 seconds to actinic radiation through complementary contact positive transparencies of circuit patterns in register with the through-holes in the sheet using the exposure source described in Example 1.

The removable support is removed from each side of the imaged reinforced photopolymer sheet and copper powder is dusted onto the surfaces and into the through-holes. After removing excess copper powder, each surface is uniformly exposed for 3 minutes to the exposure source described in Example 1. The reinforced sheet with catalyzed patterns and holes is immersed in an electroless plating solution described in Example 1. Within one hour, a conductive pattern is obtained on both sides of the sheet and in the through-holes so that circuit patterns are conductive from one side of the sheet to the other side through plated through-holes. To improve the ductility of the copper, the two-sided printed circuit board is baked for 1 hour at 160° C.

EXAMPLE 4

A multilayered printed circuit board with plated through-holes is prepared using an electroless plating process and a self-supported photohardenable sheet.

A two-sided, printed circuit board with plated through-holes is prepared as described in Example 3. A photopolymerizable element described in Example 1 comprising in order a removable polyethylene terephthalate support, a photopolymerizable layer, and a strippable cover film, is predrilled with holes in a pattern which corresponds to plated through-holes of the circuit board. The strippable cover film is removed, and the photopolymerizable layer with the holes therein is laminated to one side of the circuit board so that the holes are in register with the plated through-holes. The reverse side of the board is laminated in like manner with a second photopolymerizable layer with predrilled holes.

Both sides of the laminated element are imagewise exposed for 30 seconds to actinic radiation through complementary contact positive transparencies of circuit patterns in register with the through-holes in the element. As described in Example 3 the removable support and cover film are removed, the unexposed circuit pattern and through-holes are toned with copper powder, the element surfaces are uniformly post exposed to actinic radiation, and the catalyzed circuit pattern is plated by immersion in an electroless plating bath as described in Example 1. After baking for 1 hour at 160° C. a four layered printed circuit board is obtained with plated through-hole interconnections between the four circuit layers.

EXAMPLE 5

A single-sided, printed circuit board with plated through-holes is prepared using an electroless plating process and a self-supported photohardenable sheet reinforced with a foraminous material.

A 2 inch × 4 inch (~5×10 cm.) piece of filter paper was soaked in a photopolymerizable solution prepared as in Example 1 (solution A), U.S. Pat. No. 3,649,268. The saturated paper which is a self-supported, photohardenable sheet is allowed to dry at 55° C and a 0.001 inch cover film of polyethylene terephthalate is laminated to each side.

Through-holes are introduced into the laminated sheet by punching holes in pad areas of the circuit pattern to be imaged, and the sheet is imagewise exposed for 5 seconds through a contact positive transparency in register with the through-holes using the carbon arc source of Example 1.

The polyethylene terephthalate cover film arc is removed from the imaged surface and copper powder is applied to the exposed surface and through-holes to give a clean, clearly defined circuit pattern.

Both sides of the imaged sheet are uniformly exposed to actinic radiation for 60 seconds as described in Example 2, and the remaining cover film is stripped from the sheet. The sheet is immersed for 4 hours in the electroless copper plating solution described in Example 1 to produce a conductive, printed circuit pattern on a self-supported photohardenable sheet.

I claim:

1. A process for preparing printed circuit boards having plated through-holes from a self-supported, adherent, photohardenable sheet which comprises, in either order,
   1. exposing a surface of the self-supported sheet imagewise to actinic radiation to reduce adherence of the areas receiving radiation; and
   2. introducing through-holes into the sheet; then
   3. applying to the surface of the sheet and the through-holes therein a material catalytic to electroless plating which adheres to the underexposed surface and the hole areas; and
   4. applying electroless plating solution to the catalytic image and through-hole surfaces to produce an electrically conductive circuit.

2. A process according to claim 1 wherein the self-supported adherent, photohardenable sheet is a substantially homogeneous, solid, photohardenable sheet.

3. A process according to claim 1 wherein the self-supported adherent, photohardenable sheet is reinforced with a a foraminous material.

4. A process according to claim 3 wherein the foraminous material is a nonwoven fabric.

5. A process according to claim 3 wherein the foraminous material is a woven cloth.

6. A process according to claim 3 wherein the foraminous material is paper.

7. A process according to claim 1 wherein the photohardenable sheet is a photopolymerizable sheet comprised of an addition-polymerizable, ethylenically unsaturated compound, a macromolecular orgnanic polymer binder, and a polymerization initiator activatable by actinic radiation.

8. A process according to claim 1 wherein after step (3) the sheet is baked to harden the underexposed areas of the sheet.

9. A process for preparing printed circuit boards having plated through-holes from a self-supported photopolymerizable sheet having on each surface a removable cover film which comprises, in either order,
   1. exposing a surface of the reinforced sheet imagewise to actinic radiation; and
   2. introducing through-holes into the sheet; then
   3. removing the removable cover film from the exposed side of the sheet without transfer thereto of exposed or underexposed areas of the photopolymerizable material;
   4. applying to the surface of the sheet and the through-holes therein a material catalytic to electroless plating which adheres to the underexposed surface and the hole areas;
   5. removing the second removable cover film; and 6. applying electroless plating solution to the catalyzed areas and through-holes to produce an electrically conductive circuit.

10. A process for the preparation of complementary printed circuits on each side of a self-supported photopolymerizable shet having on each surface a removable cover film, which comprises, in either order,
  1. exposing both surfaces of the self-supporting sheet imagewise to actinic radiation to reduce adherence of the areas receiving radiation; and
  2. introducing through-holes into the sheet; then
  3. removing the removable cover films without transfer of exposed or underexposed areas of the photopolymerizable material;
  4. applying to both surfaces of the sheet and the through-holes therein a material catalytic to electroless plating which adheres to the underexposed surfaces and the hole areas;
  5. applying electroless plating solution to the catalyzed areas and through-holes to produce an electrically conductive circuit.

11. A process for the preparation of multilayered printed circuit boards with plated through-holes from a self-supported, adherent, photopolymerizable sheet having on each surface a removable cover film which comprises,
  1. exposing the self-supported, adherent, photopolymerizable sheet through the cover film imagewise to actinic radiation;
  2. removing the cover film;
  3. applying finely divided catalyst material to the surface to form a catalytic image;
  4. treating the catalytic image with an electroless plating solution to form a printed circuit substrate; then, using the printed circuit substrate,
  5. laminating the surface of an adherent, photohardenable layer of a photohardenable element comprising an adherent photohardenable layer and a strippable cover film thereon, to the printed circuit substrate; then, in either order,
  6. imagewise exposing the laminated element through the cover film to actinic radiation; and
  7. introducing through-holes into the laminated element; then
  8. removing the strippable cover film;
  9. applying divided catalyst material to the surface and the through-holes to form a catalytic image;
  10. treating the catalytic image and holes with an electroless plating solution to form a conductive printed circuit and holes; and
  11. curing the laminated element by baking.

12. A process according to claim 11 wherein steps 5, 6, 8, 9 and 10 are carried out at least once before the complete sequence of steps 5 through 10 are completed.

* * * * *